(12) United States Patent
Morimoto et al.

(10) Patent No.: US 6,730,535 B2
(45) Date of Patent: May 4, 2004

(54) SILICON DEVICE MANUFACTURING METHOD, SILICON DEVICE, AND OPTICAL COMPONENT

(75) Inventors: Koji Morimoto, Tokyo (JP); Kouki Sato, Tokyo (JP); Masahito Morimoto, Tokyo (JP); Kazuhiro Toriumi, Nagano (JP); Taichi Tsuchiya, Nagano (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 8 days.

(21) Appl. No.: 10/291,899

(22) Filed: Nov. 8, 2002

(65) Prior Publication Data

US 2003/0162318 A1 Aug. 28, 2003

(30) Foreign Application Priority Data

Feb. 26, 2002 (JP) ........................................ 2002-050016

(51) Int. Cl.⁷ .............................................. H01L 21/00
(52) U.S. Cl. .............................. 438/50; 438/48; 438/51; 438/52; 438/53
(58) Field of Search ............................... 438/50, 51, 52, 438/53

(56) References Cited

U.S. PATENT DOCUMENTS

2001/0044165 A1 * 11/2001 Lee et al. ...................... 438/52
2003/0203530 A1 * 10/2003 Lee et al. ...................... 438/72

FOREIGN PATENT DOCUMENTS

WO      WO 98/12589      3/1998

* cited by examiner

*Primary Examiner*—Long Pham
(74) *Attorney, Agent, or Firm*—Knobbe Martens Olson & Bear LLP

(57) ABSTRACT

The silicon substrate is masked on one surface of the silicon substrate where structures like combs and beams of comb drive are not to be formed on the other surface. The unmasked areas are then etched followed by masking areas on the other surface corresponding to the structures. Finally, the unmasked areas on the other surface are again etched by anisotropic reactive ion etching to form the structures.

11 Claims, 15 Drawing Sheets

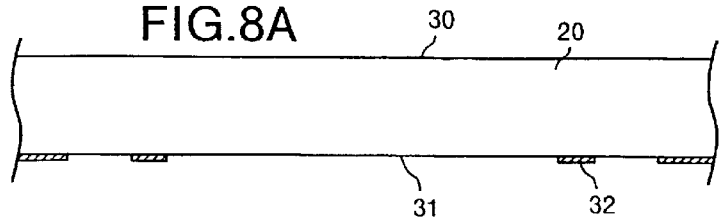
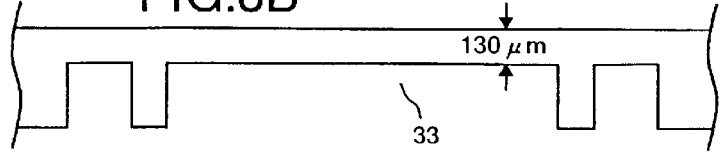
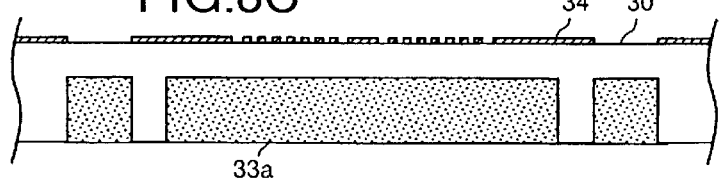
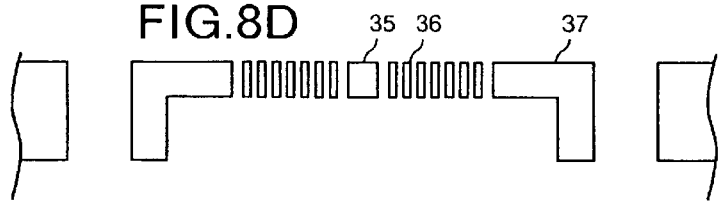
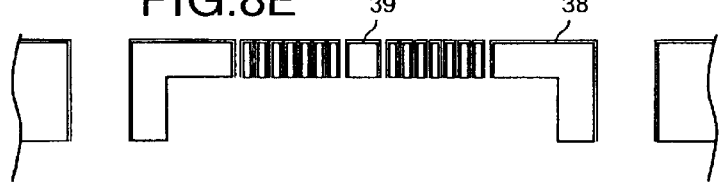
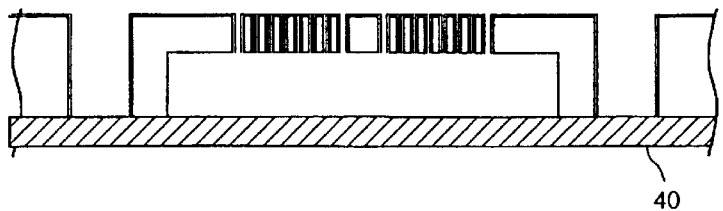
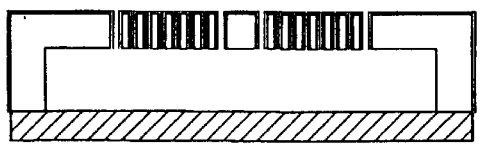

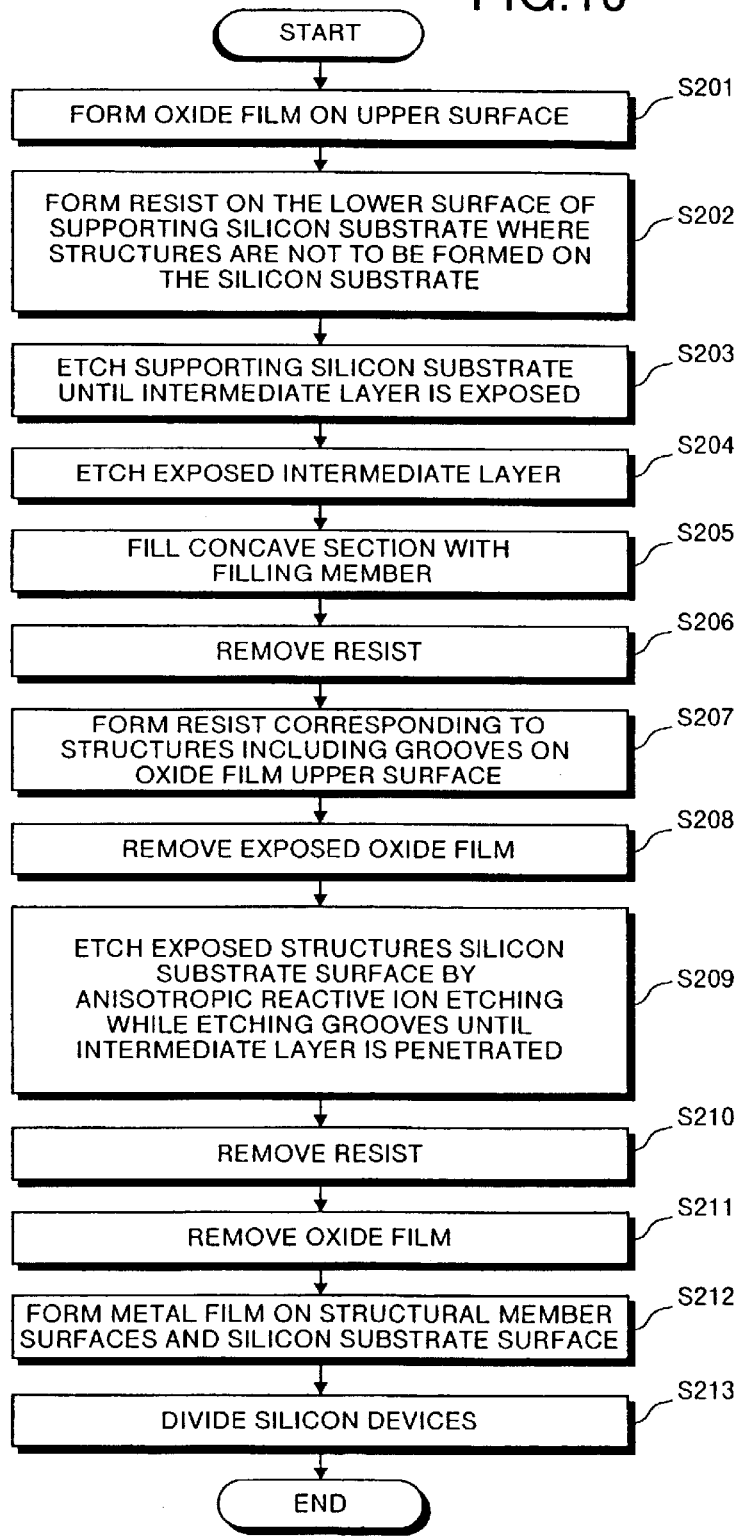

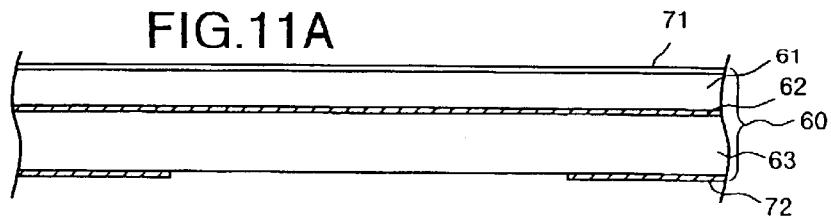
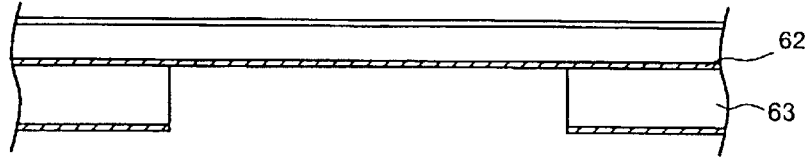
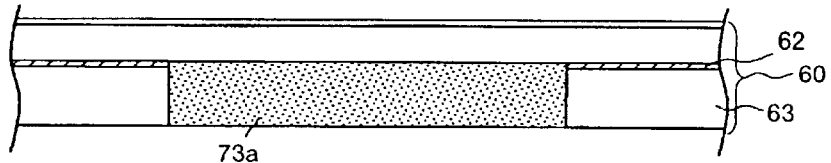
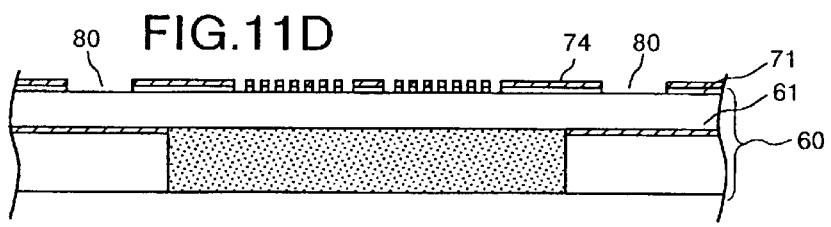
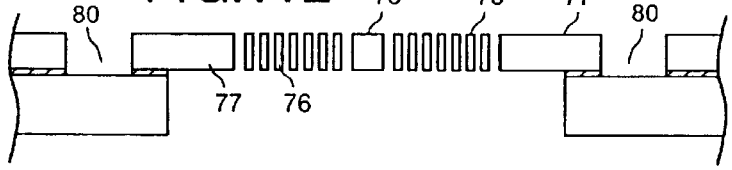
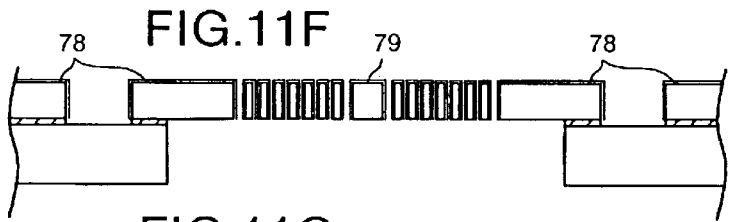

US 6,730,535 B2

SILICON DEVICE MANUFACTURING METHOD, SILICON DEVICE, AND OPTICAL COMPONENT

BACKGROUND OF THE INVENTION

1) Field of the Invention

The present invention relates to a silicon device manufacturing method, a silicon device, and an optical component.

2) Description of the Related Art

A silicon substrate is conventionally used to form micro electro mechanical systems (MEMS). FIG. 12 is a plane view which shows an example of an optical switch that is disclosed in European Patent WO98/12589. The disclosed micro electro mechanical systems are fabricated using a silicon device. FIGS. 13 to 15 are cross sectional diagrams of the silicon device that explain the manufacturing process of the silicon device. FIG. 16 is a cross-section of a 2×2 optical switch having an optical fiber arranged on the silicon device shown in FIG. 12.

With reference to FIGS. 12 to 16, a sandwich like silicon-on-insulator (SOI) wafer 139 consists of a supporting substrate 140, an intermediate insulator layer 141, and a silicon substrate 143. The supporting substrate 140 is formed by monocrystalline silicon. The intermediate insulator layer 141 is provided on the supporting substrate 140 and is formed by non-crystalline silicon dioxide ($SiO_2$) The silicon substrate 143 is provided on the intermediate layer 141. A plurality of masks 144 are formed in positions corresponding to each narrow structure 145 and wide structure 147 on the surface of the silicon substrate 143. The structures 145 and 147 correspond to the structure of the silicon device. An optical fiber 149 is inserted into insertion grooves 101a to 101d in the silicon device. The thickness of the silicon substrate 143 is decided based on the diameter of the optical fiber 149. For example, if a single mode optical fiber is used the thickness of the silicon substrate 143 is 75 $\mu$m.

As shown in FIG. 14, the silicon in the regions of the silicon substrate 143 that are not masked (exposed areas) are etched by the deep anisotropic reactive ion etching method until the surface of the intermediate layer 141 is exposed. The reactive ion etching is carried out between the electrodes and the SOI wafer 139. The reactive ion etching is carried out under conditions of pressure of 2.6 Pa, temperature of −95° C. and DC bias of −70 V, high frequency of 13.5 $MH_z$, air flow SF of 200 $cm^3$/min, oxygen supply of 16 $cm^3$/min, air current CHF of 10 $cm^3$/min, and an inductively coupled plasma that serves as the source of ion.

After the etching of the silicon substrate 143, the intermediate layer 141 is etched. The portion of the intermediate layer 141 present between the narrow structures 145 and the supporting substrate 140 is completely removed by etching using 48% hydrofluoric acid. As shown in FIG. 15, the intermediate layer 141 present between the wide structures 147 and the supporting substrate 140 is partially etched. As a result, the wide structures 147 are supported by the supporting substrate 140.

FIG. 12 is the linear representation of the narrow structures 145 that are formed by the etching process. The narrow structures 145 consists of a mirror 107, a holder 119, a plurality of elastic joint plates 113a to 113d, a plurality of support beams 121a to 121d, a plurality of spring members 127a to 127d, a plurality of narrow structures 131, 133 and 135, and a plurality of comb like structures 123a to 123d.

Each of the spring members 127a to 127d consists of a plurality of plate springs. For example, spring member 127a has plate springs 130a, 130b, 132a, 132b, 134a, 134b, 136a, and 136b. The comb structures 123a to 123d and the intermediate layer 141 present under the comb structures are also etched during the etching process. The intermediate layer 141 present under the comb sections is held by a base 125 of the SOI wafer 139.

The mirror 107 has a reflecting layer that reflects light. The optical fiber 149 is inserted into each insertion groove 101a to 101d (see FIG. 16). A 2×2 optical switch is thus formed. In this 2×2 optical switch, the mirror 107 is used to change the direction of light. The mirror 107 is operated by a comb micro-actuator driven by electrostatic force.

Thus, conventionally, the deep anisotropic reactive ion etching method is used to remove the unmasked parts of the silicon substrate 143 and to obtain the structure shown in FIG. 14. However, the duration for which the etching is performed (etching duration) should be very accurately controlled. For example, if the etching duration is too short, the silicon substrate 143 cannot be etched until the intermediate layer 141 and the narrow structures 145, wide structures 147, and the comb structures 123a to 123d are not formed as desired. On the other hand, if the etching duration is too long (over-etching), etching gas is expelled on both sides of the intermediate layer 141 so that even the lower sides of the narrow structures 145 are also etched and the narrow structures 145 are not formed again as desired. In addition, the parts of the intermediate layer 141 under the wide structures 147 are removed, making it difficult to hold the structures 147. FIG. 17 is a cross-section of the structures 145 when over-etching is performed. The sides of the structures 145 and 147 present on the intermediate layer 141 side are excessively etched causing the inaccurate formation of the structures 145 and 147. Apart from etching duration management other factors such as pressure and temperature play an important role in the etching process.

The silicon device using a silicon substrate is cheaper than the silicon device using a SOI substrate. Hence there is a need for an inexpensive method to manufacture silicon device using silicon substrate.

SUMMARY OF THE INVENTION

It is an object of the present invention to provide a reliable method to manufacture a silicon device having high precision. It is also an object to provide an optical component that employs the silicon device.

According to one aspect of the present invention, there is provided a method for manufacturing silicon device by etching portions of a silicon substrate that has a first and a second surface. The method comprises masking the first surface with a resist in areas on the first surface of the silicon substrate where structures are not to be formed on the second surface. This is followed by etching the first surface of the silicon substrate until desired thickness of the structures to be formed on the second surface is obtained. Then the areas on the second surface of the silicon substrate corresponding to the structures are masked with a resist. Finally, the etching of the second surface of the silicon substrate by anisotropic reactive ion etching to form the structures is performed.

According to another aspect of the present invention, a silicon device manufacturing method in which the portions of a silicon-on-insulator substrate are etched. A supporting silicon substrate, an intermediate substrate, and a silicon substrate are deposited successively on the silicon-on-insulator substrate. The areas on the supporting silicon substrate where structures are not to be formed on the silicon substrate are masked with a resist. This is followed by etching the silicon of the supporting silicon substrate until the intermediate layer is exposed. Then the intermediate layer which is exposed is etched followed by masking areas on the silicon substrate with a resist to form the structures. Finally the etching of the silicon substrate by anisotropic reactive ion etching to form the structures is performed.

According to still another aspect of the present invention, the structures of the silicon device are combs and beams of a comb drive.

According to still another aspect of the present invention, the optical component comprises of the silicon device, two optical waveguides, and an optical element.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIGS. 8A to 8G are cross sectional diagrams that explain the method of manufacturing the silicon device which constitutes the variable optical attenuator shown in FIG. 1.

FIG. 10 is a flowchart of a silicon device manufacturing method according to the second embodiment of the present invention.

FIGS. 11A to 11G are cross sectional diagrams that explain the method of manufacturing a silicon device which constitutes an variable optical attenuator in the second embodiment.

DETAILED DESCRIPTIONS

The embodiments of the present invention will be explained below, with reference to the accompanying drawings. A silicon device using a variable optical attenuator is explained in the embodiments as an example.

Figure 1:
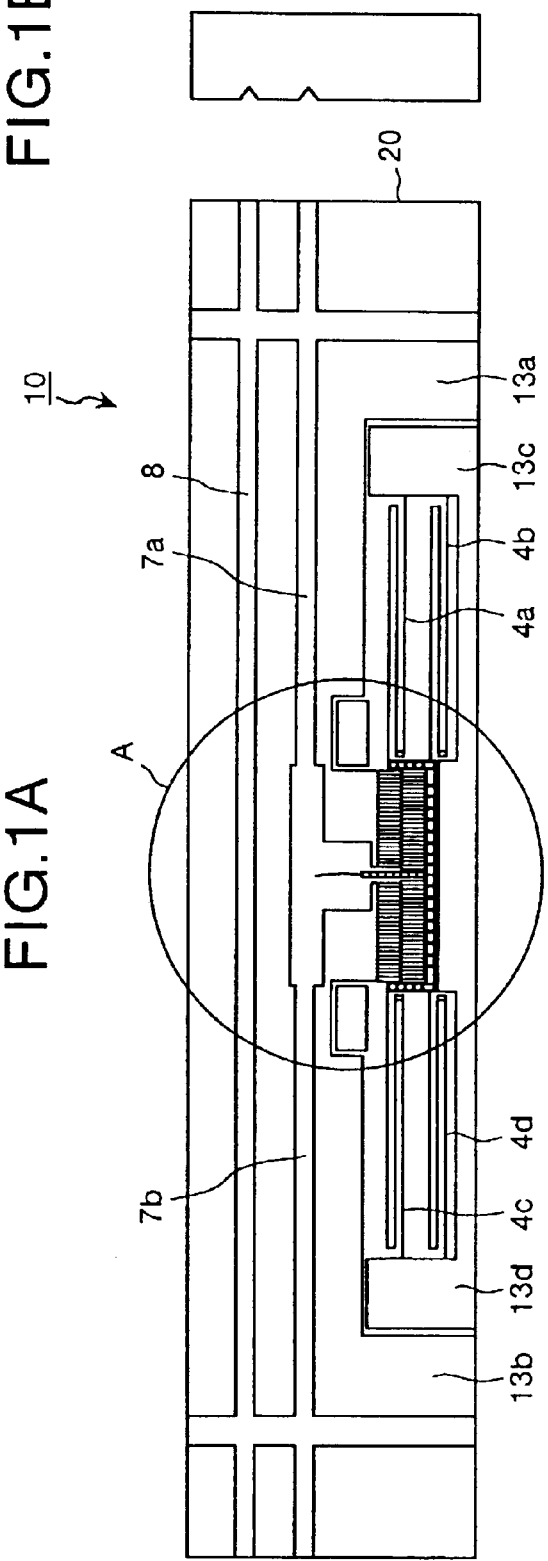
FIGS. 1A and 1B are diagrams of a variable optical attenuator that employs a silicon device according to the first embodiment of the present invention.
Figure 2:
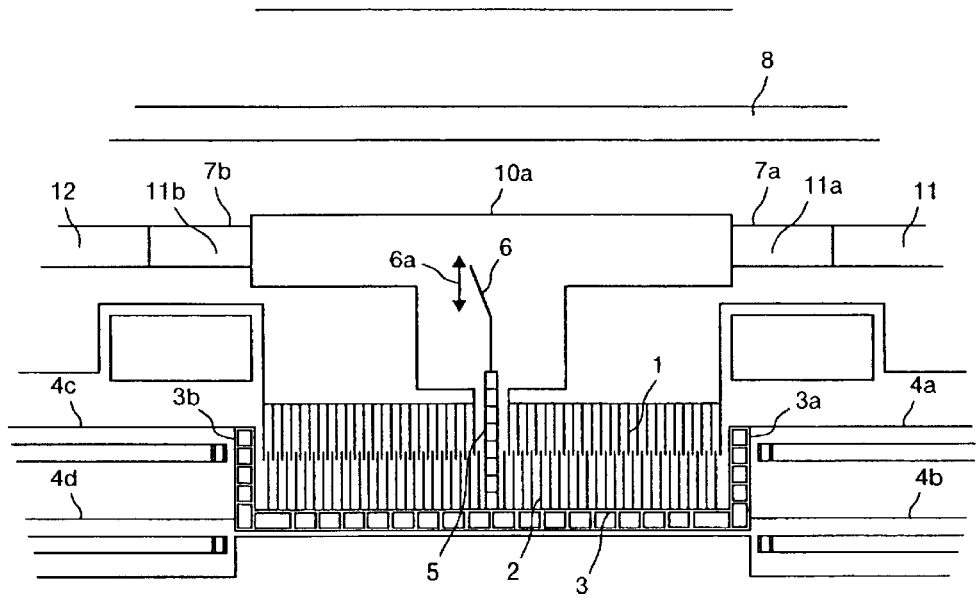
FIG. 2 is an enlarged view of the section A of the variable optical attenuator shown in FIG. 1.

FIG. 1A is a plane view of the silicon device 10 according to the first embodiment of the present invention. FIG. 1B is a right side view of the silicon device 10. FIG. 2 is an enlarged view of section A shown in FIG. 1A. Reference numeral 20 indicates a silicon substrate. The silicon substrate 20 has a surface orientation (100) and a thickness of 330 $\mu$m.

As shown in FIG. 1A and FIG. 2, the silicon device 10 includes a fixed comb 1, a movable comb 2, a beam for fixing the movable comb (movable comb fixing beam) 3, connection beams 3a and 3b, a plurality of spring beams 4a to 4d, a shutter plate 6, a holder 5, and a plurality of grooves 7a, 7b, and 8. Optical fibers 11 and 12 are inserted into grooves 7a and 7b respectively. The fixed comb 1 is directly connected to the main body of the silicon substrate 20. The movable comb 2 is fixed to the movable comb fixing beam 3. The connection beams 3a and 3b are provided on either sides of the movable comb fixing beam 3. The connection beam 3a is connected to the silicon substrate 20 by spring beams 4a and 4b. The connection beam 3b is connected to the silicon substrate 20 by spring beams 4c and 4d. The shutter plate 6 is formed at the end of the holder 5. The base of the holder 5 that is formed out of a beam is connected to the center of the movable comb fixing beam 3. The tip of the shutter plate 6 is perpendicular to the direction of the axis of light. The tip of the shutter plate 6 is inclined with respect to the plane that is perpendicular to insertion grooves 7a and 7b. The fixed comb 1 and the movable comb 2 are arranged so that their teeth are pinched together.

The optical fibers 11 and 12 are fixed to the insertion grooves 7a and 7b respectively using epoxy based resin adhesive. The graded index (GI) fibers 11a and 11b bare fused and connected to the tip of the single mode (SM) optical fibers 11 and 12. The tips of the GI fibers 11a and 11b are arranged on both sides of the variable attenuator 10a. The GI fibers 11a and 11b have a length of 1.013 mm and a beam spot diameter of 72 $\mu$m. The GI fibers 11a and 11b collimate a light beam that is propagated between the optical fibers 11 and 12.

If a voltage is applied to the fixed comb 1 and the movable comb 2 through a plurality of bonding pads 13a, 13b, 13c and 13d, the pinching between the combs 1 and 2 are changed. The change of pinching between the combs 1 and 2 is brought about by the electrostatic force generated based on the amplitude of the applied voltage. The movable comb 2, the movable comb fixing beam 3, the holder 5, and the shutter plate 6 moves in the direction of arrow 6a relative to the position of the fixed comb 1. The shutter plate 6 controls the amount of light propagated between the optical fibers 11 and 12 according to the extent of pinching of the combs 1 and 2. If the pinching between combs 1 and 2 is more, the shutter plate 6 shields large amount of light. If the pinching between combs 1 and 2 is less, the shutter plate 6 shields less amount of light. It is hence possible to attenuate the quantity of light propagated between the optical fibers 11 and 12. The movable comb 2 is restored to an initial state by the restoring force of the spring beams 4a to 4d. The quantity of light shielded by the shutter plate 6 is determined by the balance between the restoring force of the spring beams 4a to 4d and the electrostatic force of the combs. It is hence possible to attenuate and adjust the quantity of light.

A comb type actuator driving the shutter plate 6 in the silicon substrate 20 is thus realized. The silicon device 10 uses a variable optical attenuator and is provided with optical fibers 11 and 12.

Figure 3:
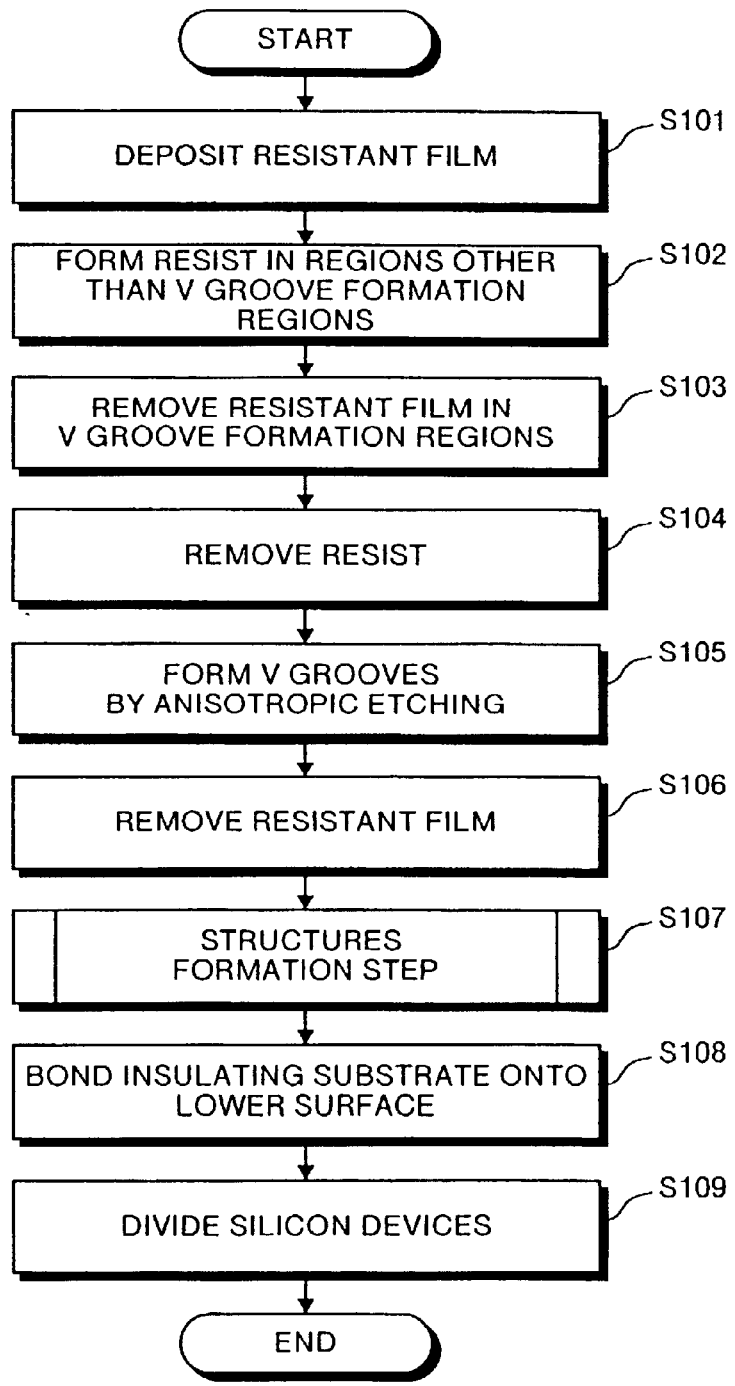
FIG. 3 is a flowchart which shows a silicon device manufacturing method in the first embodiment of the present invention.
Figure 4:
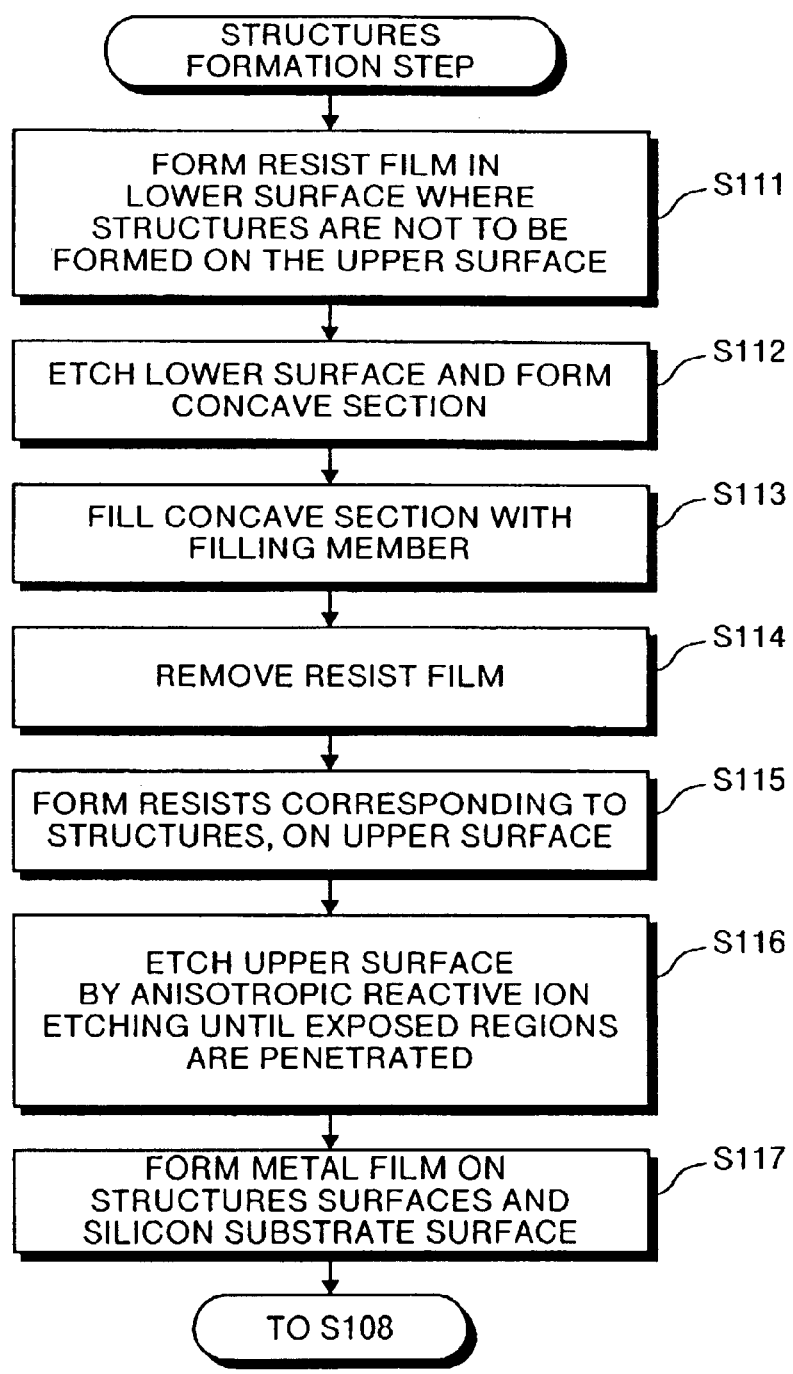
FIG. 4 is a detailed flowchart which shows the steps of forming structures shown in FIG. 3.
Figure 5:
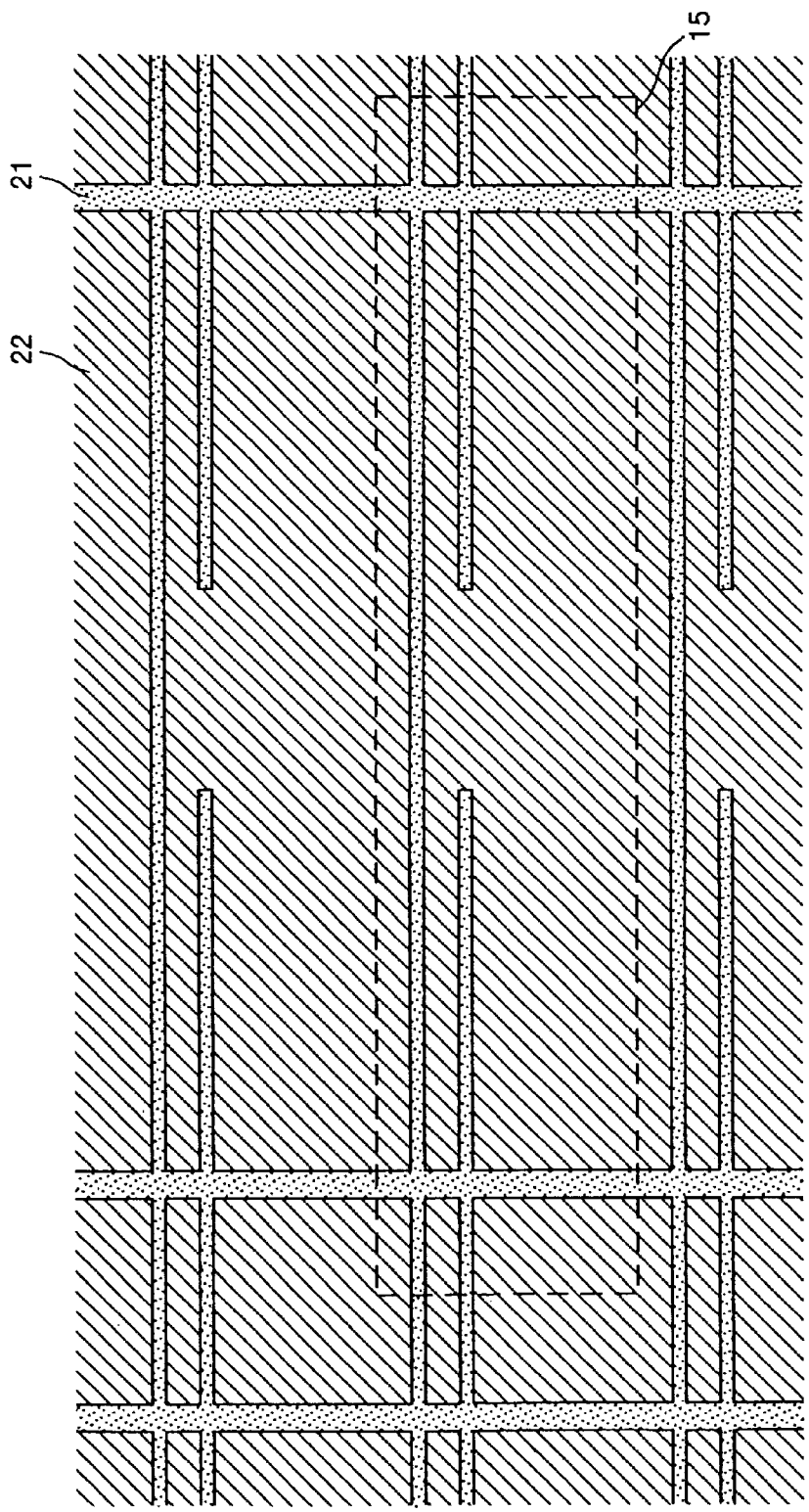
FIG. 5 is a plane view which explains the method of manufacturing the silicon device which constitutes the variable optical attenuator shown in FIG. 1.
Figure 6:
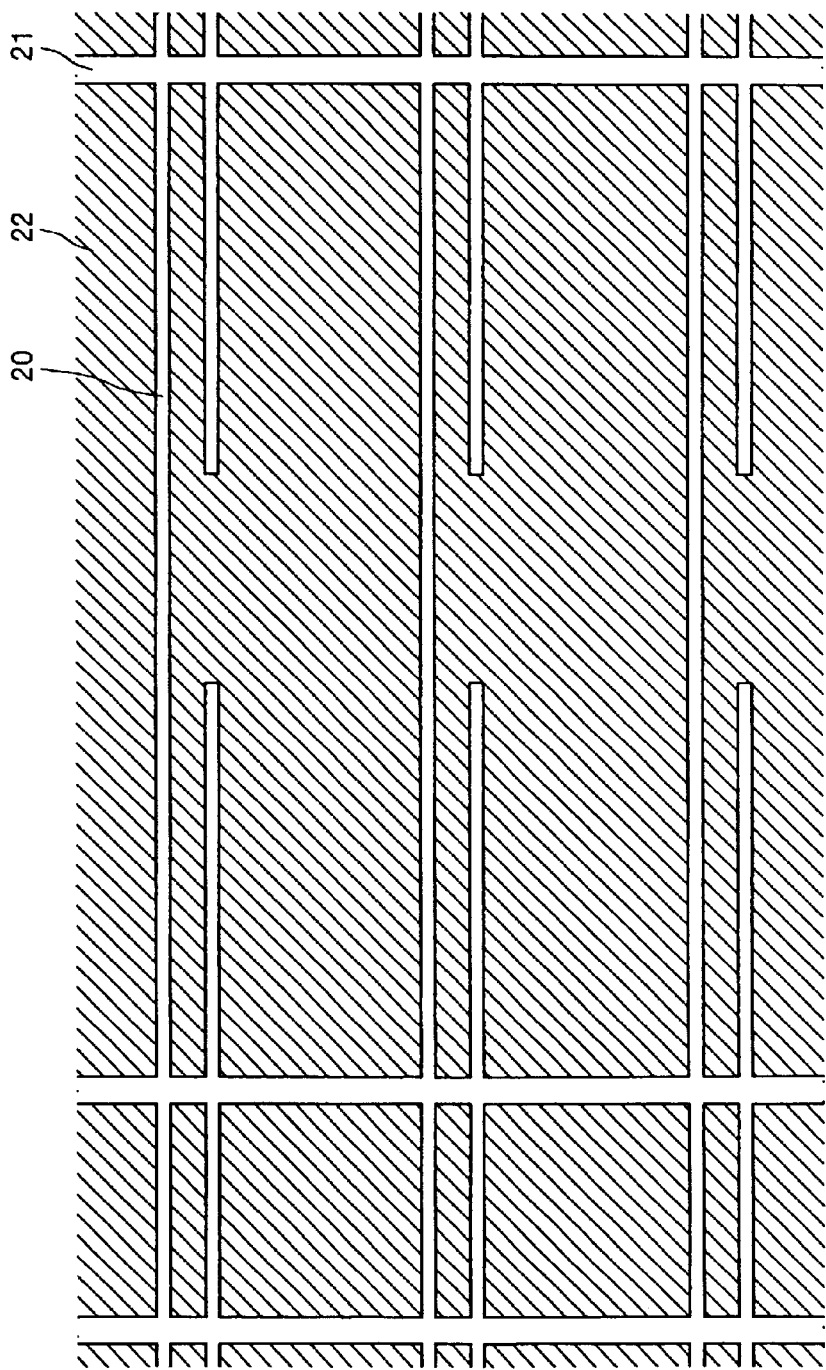
FIG. 6 is a plane view which explains the method of manufacturing the silicon device which constitutes the variable optical attenuator shown in FIG. 1.
Figure 7:
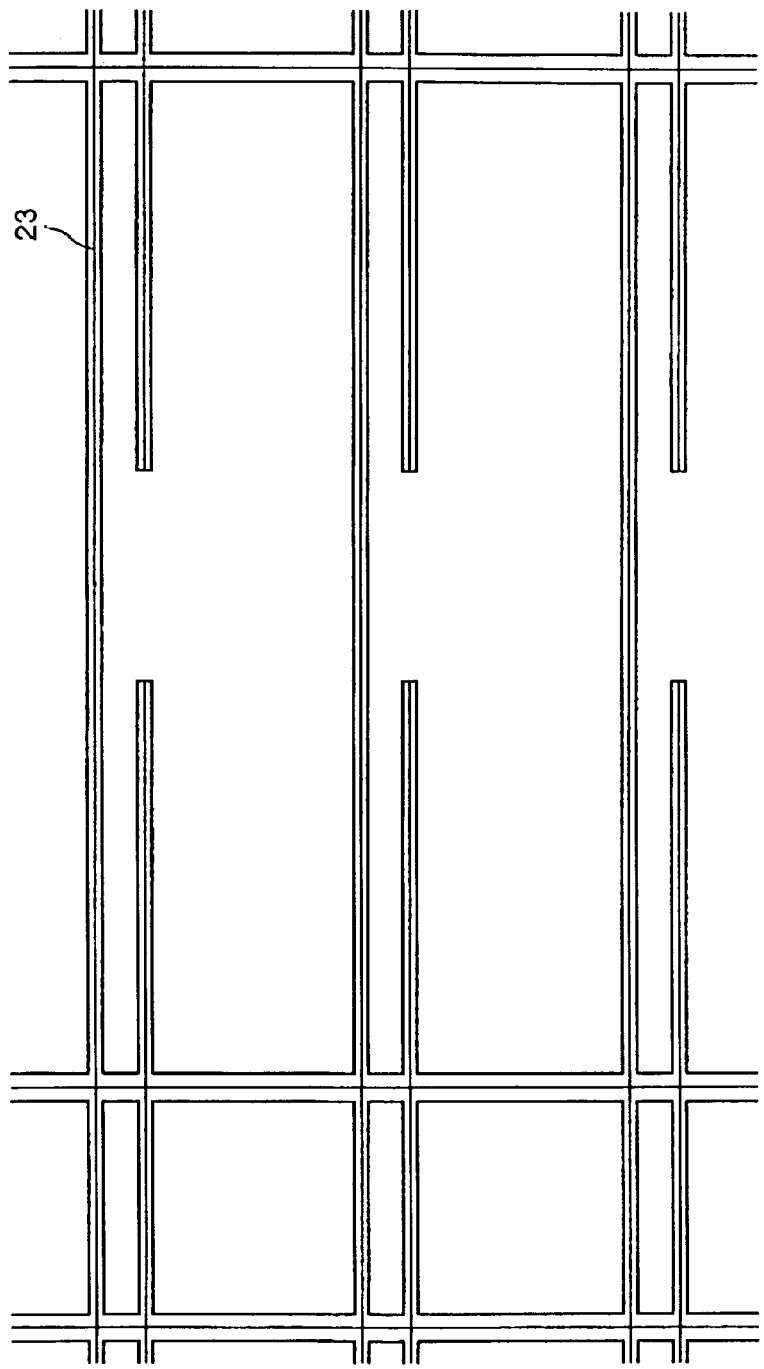
FIG. 7 is a plane view that explains the method of manufacturing the silicon device which constitutes the variable optical attenuator shown in FIG. 1

A method of manufacturing the silicon device 10 using a variable optical attenuator will be explained next. FIG. 3 and FIG. 4 are flowcharts that show a silicon device manufacturing method in the first embodiment of the present invention. FIGS. 5 to 7 are plane views that explain the manufacturing steps of the silicon device 10. FIGS. 8A to 8G are cross sectional diagrams that explain the manufacturing steps of the silicon device 10.

A resistant film 21 of gold, chromium and the like is formed on the surface of the silicon substrate 20 (step S101). The resistant film 21 is resistant to silicon wet etching. As shown in FIG. 5, a resist 22 masks the areas other than where the V grooves 23 (see FIG. 7) are to be formed (step S102). The area 15 of FIG. 5 indicates the area of silicon substrate 20 shown in FIG. 1.

As shown in FIG. 6, the exposed resistant film 21 is removed to expose silicon in areas where the V grooves 23 are to be formed (step S103). The resist 22 is then removed (step S104). As shown in FIG. 7, a plurality of V grooves 23 is formed on the upper part of the silicon substrate 20 by anisotropic etching (step S105). The V grooves 23 correspond to grooves like 7a, 7b, and 8 of FIG. 1A and FIG. 2. The grooves having a V shaped cross section (V grooves) 23 takes a V shape because if silicon having surface orientation (100) is subjected to wet anisotropic etching, the etching progresses along the plane (111) which is at of 54.7° with respect to the surface. As shown in FIG. 7 the remaining resistant film 21 is also removed to form V grooves 23 (step S106).

Three-dimensional structures such as movable combs are formed (step S107). The formation of the structures is explained in FIG. 4 and FIGS. 8A to 8G. As shown in FIG. 8A, the silicon substrate 20 consists of the lower surface 31 and the upper surface 30. The resist 32 are formed as masks in the lower surface 31 where the structures of upper surface 30 are not to be formed (step S111). The resist 32 are made of material that is resistant to etching.

As shown in FIG. 8B, the exposed silicon on the lower surface 31 is etched from below forming concave structures 33 (step S112). The thickness of the structures surface 30 is set at 130 $\mu$m when the lower surface 31 is etched. As shown in FIG. 8C, the formed concave structures 33 are filled with filler 33a (step S113). The remaining resist 32 is also removed (step S114). The filler 33a is made of a material that is resistant to etching. Apart from filling the concave structures with filler 33a, convex structures may also be fitted into the concave structures 33. The convex structures correspond to the concave structures 33 and resist is applied to the surface of the convex structures. Moreover, the step S113 of filling the concave areas may even be omitted.

As shown in FIG. 8C, a plurality of resist 34 corresponding to the structures on the upper surface 30 of the silicon substrate 20 are formed (step S115). As shown in FIG. 8D, exposed silicon in regions other than regions masked by resist 34 is deeply etched by anisotropic reactive ion etching (step S116). As a result, sections such as a shutter section 35, a plurality of comb sections 36, and two spring sections 37 are formed. The shutter section 35 consists of the holder 5 and the shutter plate 6. The comb sections 36 include the fixed comb 1 and the movable comb 2. The spring sections 37 include spring beams 4a to 4d and the like. The structures formed have a thickness of 130 $\mu$m. The material filled into the concave structures 33 may be of low grade but must have high heat conductivity. The filler is removed after the etching is completed.

As shown in FIG. 8E, a metal film is formed on the surfaces of the structures and the silicon substrate 20 (step S117). The metal film functions as a mirror film 39 for the shutter plate 6. The area covered by the metal film on the surface of the silicon substrate 20 functions as bonding pad sections 38 for bonding pads 4a to 4d when a voltage is applied to the combs.

As shown in FIG. 8F, an insulating substrate 40 is bonded to the lower surface 31 of the silicon substrate 20 (step S108). The insulating substrate 40 is the silicon substrate that is coated with an oxide film. Thus, the silicon device 10 having a structure as shown in FIG. 8G is obtained.

Figure 9:
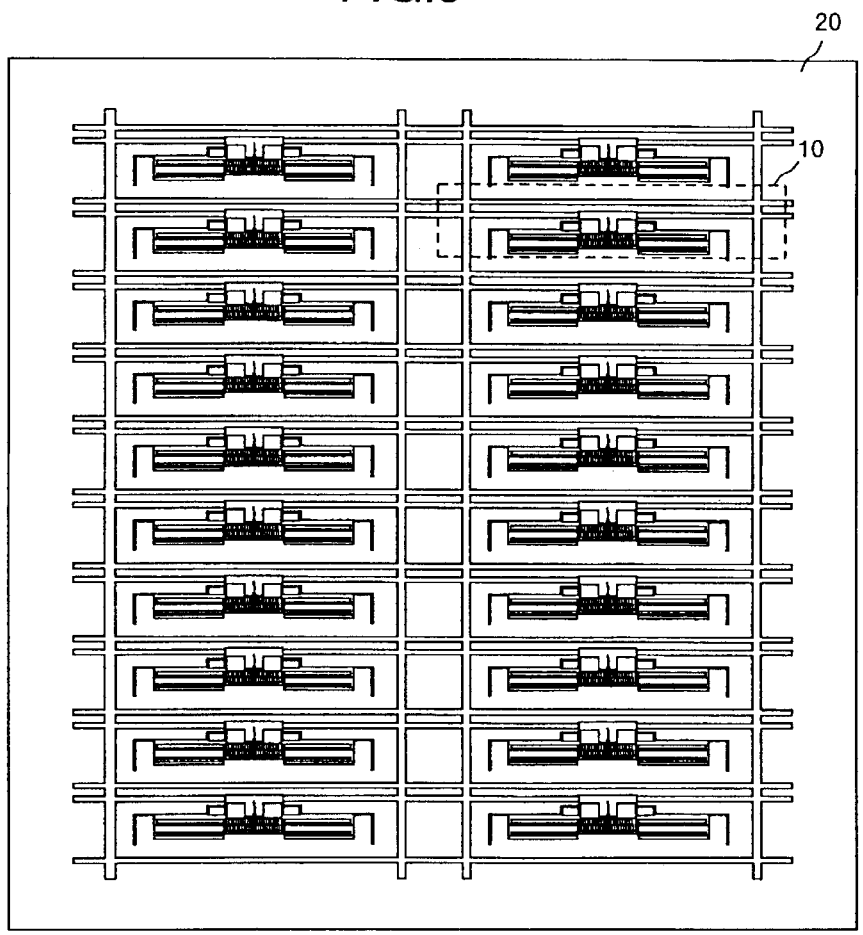
FIG. 9 is a plane view that shows the formation of plurality of silicon devices formed on a silicon wafer.
Figure 12:
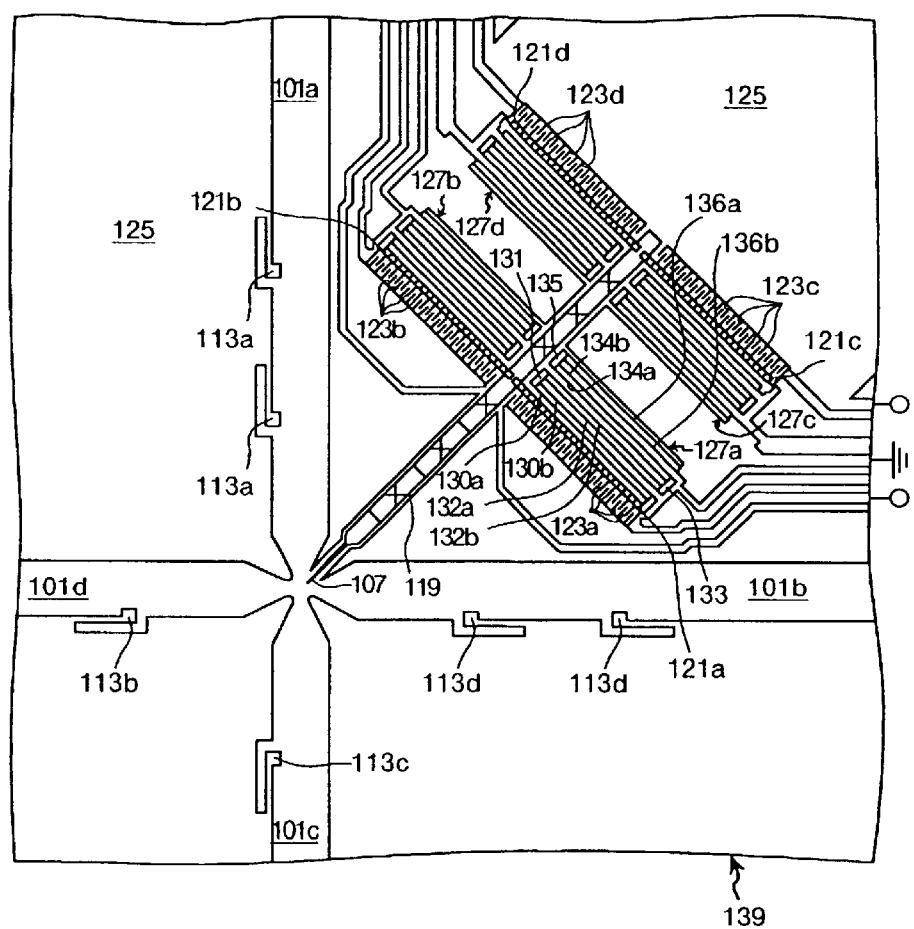
FIG. 12 is a plane view that shows the structure of the silicon device in a conventional 2×2 optical switch which is formed using an SOI substrate.
Figure 13:
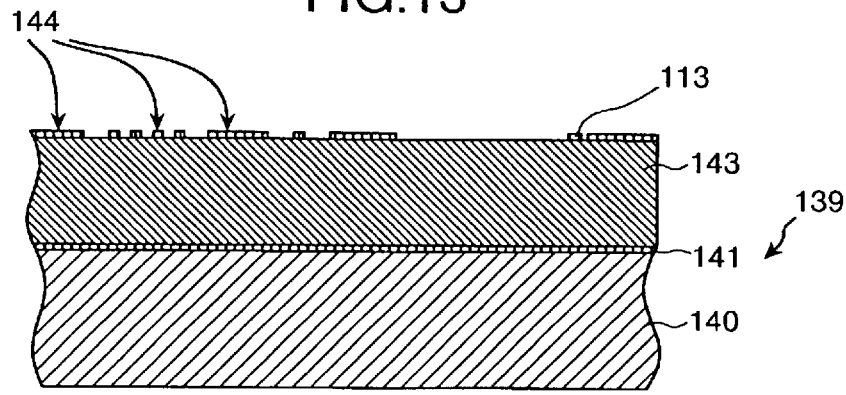
FIGS. 13 to 15 are cross sectional diagrams that explain the steps of manufacturing the silicon device shown in FIG. 12.
Figure 14:
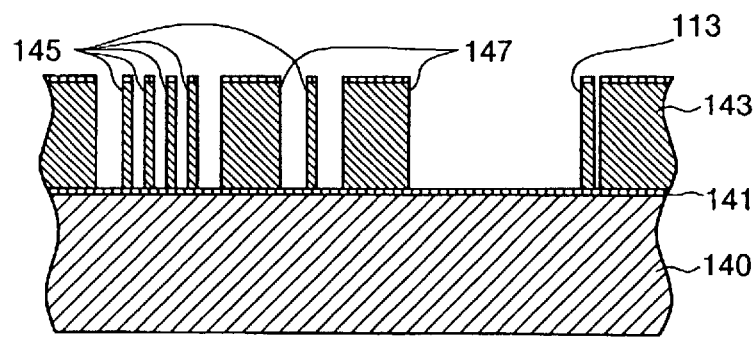
Figure 15:
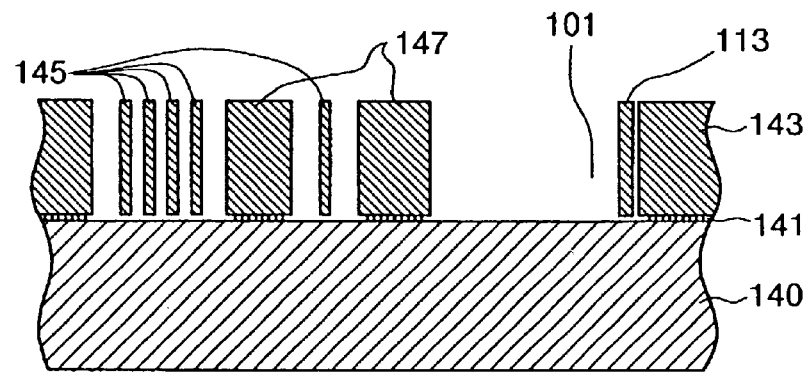
Figure 16:
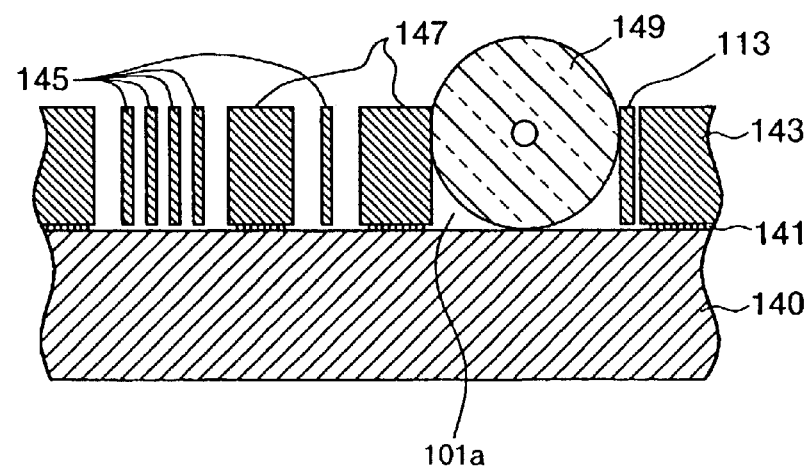
FIG. 16 is a cross sectional diagram of the 2×2 optical switch having an optical fiber arranged on the silicon device shown in FIG. 12.
Figure 17:
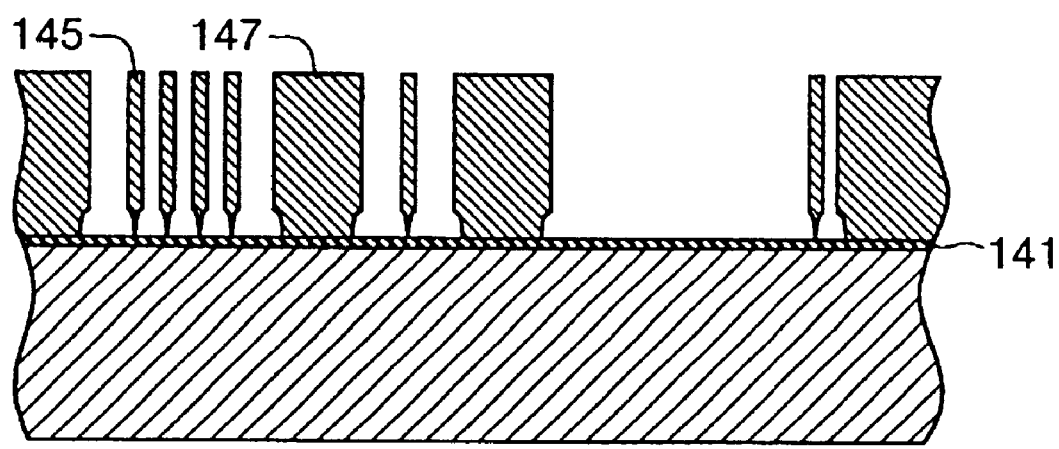
FIG. 17 is a cross sectional diagram that shows the structure of a conventional silicon device when the silicon device is over-etched.

As shown in FIG. 9, a plurality of silicon devices 10 are formed on the silicon substrate 20 in the silicon wafer. Then the silicon devices 10 are separated and divided by dicing (step S109). The bonding pads 13a and 13b are electrically separated from the bonding pads 13c and 13d respectively, during the separation of the silicon devices 10. The optical fibers 11 and 12 shown in FIG. 1 are provided as the variable optical attenuator in the silicon device. The shutter plate 6 or a mirror may be fixed to the holder 5 as the optical element.

A reliable method of manufacturing a silicon device 10 using a silicon on insulator (SOI) substrate is explained in the second embodiment of the present invention. Note that, in the first embodiment, the silicon device is formed using the silicon substrate 20.

FIG. 10 is the flowchart of a silicon device manufacturing method that explains the second embodiment of the present invention. FIGS. 11A to 11G are cross sectional diagrams that explain the manufacturing steps of a silicon device according to the second embodiment. The cross sectional diagrams FIGS. 11A to 11G correspond to the silicon device 10 shown in FIG. 1. The silicon device according to the second embodiment is used as a variable optical attenuator. An SOI substrate 60 consists of a supporting silicon substrate 63 of thickness 500 $\mu$m, an intermediate SiO$_2$ layer 62 of thickness 2 $\mu$m, and a silicon substrate 61 having a plurality of structures of thickness 130 $\mu$m. Rectangular grooves 80 and structures are formed since the silicon substrate 61 is not monocrystalline. Note that V shaped grooves are formed in the first embodiment.

As shown in FIG. 11A, an oxide film 71 is formed by thermal oxidation on the upper surface of the silicon substrate 61 (step S201). As shown in FIG. 11A, a plurality of resists 72 mask the areas on the lower surface in the supporting silicon substrate 63 corresponding to the areas in the upper surface of the SOI substrate 60 where the structures are not to be formed (step S202). The resists 72 are made of a material that is resistant to etching (step S203).

As shown in FIG. 11B, the silicon in the unmasked exposed areas of the supporting silicon substrate 63 is etched until the intermediate layer 62 is exposed (step S203). Further, the exposed intermediate layer is also etched (step S204). A filler 73a is filled into the concave section formed by the etching of the supporting silicon substrate 63 (step S205). As shown in FIG. 11C, the remaining resists 72 in the lower surface of the SOI substrate 60 are also removed (step S206). The filler 73a is removed after etching is completed. Convex structures having shape that corresponds to the concave structures may be prepared, resist may be applied on the surface of the convex structures and the resulting structure may be fitted into the concave structures instead of filling the concave structures with filler. The step S205 of filling the concave areas may also be omitted.

As shown in FIG. 1D, a resist 74 is formed on the upper surface of the silicon substrate 61 coated with an oxide film 71 in areas where structures are to be formed (step S207) The exposed oxide film 71 is then removed (step S208).

The surface of the exposed silicon substrate 61 is etched by deep anisotropic reactive ion etching until the silicon is completely removed up to the intermediate layer 62 corresponding to the grooves 80 and the structures. As shown in FIG. 11E, the intermediate layer 62 corresponding to the exposed grooves 80 is removed (step S209). As a result, the structures and the grooves 80 are formed. As shown in FIG. 11E, the upper surface of the silicon substrate 61 includes a shutter section 75, a plurality of comb sections 76 and two spring sections 77. The resist 74 is removed (step S210) and the oxide film 71 is removed (step S211).

As shown in FIG. 11F, a metal film is formed on the surfaces of the structures and the silicon substrate 61 (step S212). The metal film on the surface of the structures functions as a mirror film 79. The metal film on the surface of the silicon substrate 61 functions as bonding pad section 78.

A plurality of silicon devices each having the explained configuration are formed on the SOI substrate 60. As shown in FIG. 11G, each silicon device is separated by dicing thereby forming individual units (step S213).

The oxide film 71 present on the upper surface of the SOI substrate 60 is used to intensify the adhesiveness of the resist 74 that is formed on the oxide film 71. Similar to the first embodiment, the formation of the oxide film 71 may also be omitted here. It is possible to realize an easier manufacturing method by not using the oxide film 71, as steps S208 and S211 are eliminated.

The arrangement of the respective silicon devices formed on the SOI substrate 60 is the same as that shown in FIG. 9. When the respective silicon devices are divided, the bonding pads 13a and 13b are electrically separated from the bonding pads 13c and 13d, respectively. Further, the optical fibers 11 and 12 shown in FIG. 1 are provided in the silicon device to obtain the variable optical attenuator. The shutter plate 6 or a mirror may be fixed to the holder 5 as the optical element.

The silicon device 10 shown in FIG. 1 is manufactured by the methods of the first or second embodiments. Thus formed silicon device 10 may be immersed in matching oil. In this case, an arrangement is provided such that the matching oil seals the gap between the optical fibers 11 and 12 and the gap between the fixed comb 1 and the movable comb 2. The silicon oil may be used as the matching oil. The silicon oil has a refractive index of 1.4 to 1.5 which is almost the same as the optic fiber. An arrangement should be provided such that the matching oil does not leak.

If the matching oil is filled in the gap between the optical fibers 11 and 12, the collimated light beams emitted from the GI fibers 11a and 12a propagate through the matching oil. It is therefore possible to decrease the difference in refractive index between the GI fibers 11a and 12a that arises when the gap between the optical fibers 11 and 12 is filled with air. Moreover, it is possible to suppress the returning of light. If the gap between the fixed comb 1 and the movable comb 2 is filled with matching oil, it is possible to increase the dielectric constant between the fixed comb 1 and the movable comb 2. It is hence possible to obtain a larger displacement of the combs by filling the gap between the fixed comb 1 and the movable comb 2 with matching oil when voltage is applied to the fixed comb 1 and the movable comb 2 than when the gap is filled with air.

In the first and second embodiments, the silicon device manufacturing methods have been explained taking the example of a silicon device using a variable optical attenuator. However, the present invention is not only limited to these embodiments but is also applicable to other optical components using a silicon device. For example, 2×2 optical switch is an optical component that employs a silicon device.

It is hence possible to easily, reliably and inexpensively manufacture a silicon device that has a three-dimensional movable section in a silicon substrate. The management of etching duration is also easy. In addition, it is also possible to inexpensively manufacture the silicon device as the conventional SOI substrate is not used.

According to the present invention, crystalline V grooves are formed by anisotropic etching. Therefore, grooves for optical fiber waveguides is easily formed even if a single silicon substrate is used.

According to the present invention, etching resistant material is employed to form structures.

According to the present invention, bonding pads and the like are easily formed by using the metal film.

According to the present invention, a plurality of silicon devices is manufactured by batch processing. During the process of manufacturing silicon device, electrodes can also be easily divided facilitated by the formation of the metal film.

According to the present invention, structures are formed after removal of the intermediate layer even if the SOI substrate is used in the manufacture of silicon device. This minimizes the time taken for anisotropic reactive ion etching and also stabilizes the quality of the silicon device.

According to the present invention, since rectangular grooves for optical fiber waveguides are formed by anisotropic reactive ion etching, the manufacturing steps can be easily followed.

According to the present invention, the adhesiveness of the resist is intensified by the oxide film formed on the surface of the supporting silicon substrate. The resist is used as a mask during the formation of structures. It is hence possible to stabilize the quality of the silicon device.

According to the present invention, it is possible to accurately form combs and comb beams according to the specification. Hence it is possible to predict the movement of the comb drive by simulation and the degree of light attenuation of the variable optical attenuator.

According to the present invention, the gap between the two optical waveguides and the combs of the comb drive is sealed by matching oil. It is therefore possible to decrease the change in the refractive index between the two optical waveguides. In addition, since the dielectric constant between the combs increases, it is possible to increase the comb displacement even when the same voltage is applied to the combs.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing silicon device by etching portions of a silicon substrate, the silicon substrate having a first and a second surface, the method comprising:
   a first step of masking areas on the first surface of the silicon substrate where structures are not to be formed on the second surface;

a second step of etching the first surface of the silicon substrate until desired thickness of the structures to be formed on the second surface is obtained;

a third step of masking areas on the second surface of the silicon substrate corresponding to the structures; and a fourth step of etching the second surface of the silicon substrate to completely remove the silicon by anisotropic reactive ion etching to form the structures.

2. The method according to claim 1, further comprising:

forming of a plurality of groove, for laying an optical fiber waveguide, by anisotropic reactive ion etching, the grooves having V shaped cross section.

3. The method according to claim 1, further comprising:

filling a concave section formed at the second step with a material that is resistant to etching conducted at the fourth step, wherein the step of filling is performed after the second step and before the fourth step; and removing the material filled in the concave section, wherein the step of removing the material is perform after the fourth step.

4. The method according to claim 1, further comprising:

forming of a metal film on the second surface of the silicon substrate, wherein the step of forming is performed after the fourth step.

5. The method according to claim 1, further comprising:

forming of a plurality of the silicon devices on the upper surface of a silicon wafer;

bonding an insulating substrate to the lower surface of the silicon wafer; and separating the silicon devices into individual units.

6. A method of manufacturing a silicon device wherein a supporting silicon substrate, an intermediate substrate, and a silicon substrate are successively deposited on the silicon-on-insulator substrate that is partly etched, the method comprising:

a first step of masking areas of the supporting silicon substrate where structures are not to be formed;

a second step of etching the silicon of the supporting silicon substrate until the intermediate layer is exposed;

a third step of completely removing the intermediate layer which is exposed at the second step by etching;

a fourth step of masking a reason the silicon substrate corresponding to the structures;

a fifth step of etching the silicon substrate to completely remove the silicon by anisotropic reactive ion etching to form the structures.

7. The method according to claim 6, further comprising:

forming grooves, for laying an optical fiber waveguide, by anisotropic reactive ion etching, the grooves having rectangular cross section.

8. The method according to claim 6, further comprising:

filling a concave section formed at the second step with a material that is resistant to etching performed at the fourth step, wherein the step of filling is performed ±0 after the third step and before the fourth step; and removing the material tilled iii the concave section, wherein the step of removing the material is performed after the fifth step.

9. The method according to claim 6, further comprising:

forming of a metal film on the surface of the silicon substrate, wherein the step of forming is performed after the fifth step.

10. The method according to claim 6, further comprising:

forming of an oxide film on the surface of the silicon substrate, wherein the seep of forming is performed before the first step; and removing the oxide film from the surface of the silicon substrate, wherein the step of removing is performed after the fifth step.

11. The method according to claim 6, further comprising:

forming a plurality of the silicon devices on the upper surface of a silicon wafer; and separating the silicon devices into individual units.

* * * * *